United States Patent
Delevoye

(10) Patent No.: US 7,637,155 B2
(45) Date of Patent: Dec. 29, 2009

(54) OSCILLATING MASS RESONATOR

(75) Inventor: Elisabeth Delevoye, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 407 days.

(21) Appl. No.: 11/576,777

(22) PCT Filed: Oct. 5, 2005

(86) PCT No.: PCT/FR2005/050815

§ 371 (c)(1),
(2), (4) Date: Apr. 5, 2007

(87) PCT Pub. No.: WO2006/037928

PCT Pub. Date: Apr. 13, 2006

(65) Prior Publication Data

US 2009/0249873 A1    Oct. 8, 2009

(30) Foreign Application Priority Data

Oct. 6, 2004 (FR) .................................. 04 52276

(51) Int. Cl.
*G01P 9/04* (2006.01)
*G01C 19/56* (2006.01)
(52) U.S. Cl. ............................... 73/504.12; 73/504.04

(58) Field of Classification Search .............. 73/504.04, 73/504.12, 504.14, 504.15, 504.16, 514.32, 73/514.36, 514.38
See application file for complete search history.

(56) References Cited

U.S. PATENT DOCUMENTS

| 5,349,855 | A | | 9/1994 | Bernstein et al. | |
|---|---|---|---|---|---|
| 5,635,638 | A | * | 6/1997 | Geen | 73/504.04 |
| 5,895,850 | A | | 4/1999 | Buestgens | |
| 6,761,068 | B1 | * | 7/2004 | Schmid | 73/504.14 |
| 6,843,127 | B1 | * | 1/2005 | Chiou | 73/504.12 |
| 6,892,575 | B2 | * | 5/2005 | Nasiri et al. | 73/504.12 |

FOREIGN PATENT DOCUMENTS

| DE | 44 14 237 | 10/1995 |
|---|---|---|
| DE | 195 00 800 | 12/1995 |
| DE | 44 42 033 | 5/1996 |
| FR | 2 846 740 | 5/2004 |

* cited by examiner

*Primary Examiner*—Helen C. Kwok
(74) *Attorney, Agent, or Firm*—Oblon, Spivak, McClelland, Maier & Neustadt, L.L.P.

(57) ABSTRACT

Suspension and coupling beams of oscillating masses in a device which serves, for example, as a gyro and that includes oscillating masses form a single continuous network that allows the device to have a compact design. Preferably, a junction beam surrounds the two masses.

13 Claims, 5 Drawing Sheets

OSCILLATING MASS RESONATOR

BACKGROUND OF THE INVENTION

1. Field of the Invention

The subject of the invention is an oscillating mass resonator.

2. Discussion of the Invention

This type of device is widely manufactured using micromechanical techniques and is used in accelerometers and more specifically in gyros. It is essentially made up of two oscillating masses linked to a substrate by an elastic structure as well as means for producing oscillation of the masses and means for measuring the oscillations. If masses oscillate in one direction and the object upon which the resonator is placed turns towards a second direction, Coriolis forces produce movement of the masses along a third principal direction which is perpendicular to the previous ones. This is the movement that is measured. Its amplitude is used to deduce the speed of the rotation that the resonator is subjected to.

Movements in the third direction are usually measured by means of changes in capacitance between electrodes placed beneath the oscillating masses and on the substrate. In the case which is preferred in practice of a pair of masses whose phase opposition oscillations, that is in opposite directions, are controlled, the movements in the direction of measurement and capacitance variations are opposite so that differential measurements can be used to sum the two variations in capacitance associated with each of the masses whilst overcoming certain measurement errors which arise, for example, from movement of the assembly of masses relative to the substrate.

The oscillating movement of the masses is made possible by fine structures known as beams, by which the masses are suspended from the substrate and which are capable of readily undergoing flexion in an elastic manner in the direction of oscillations. Some advanced resonators include further beams of an elastic manner in the direction of oscillations. Some advanced resonators include further beams of an analogous nature which are coupling beams and which connect the masses together and sometimes to the substrate. These coupling beams are arranged in such a way that they readily deform when the masses oscillate in the desired phase relationship, but exhibit a high degree of stiffness to oscillations in other phase relationships in order to encourage oscillations in the desired phase relationship and thus reduce the consequences of lack of oscillation synchronisation on measurements.

Document U.S. Pat. No. 5,635,638 A describes such a resonator. The means for producing oscillations are electrical vibrators placed behind the oscillating masses. The suspension beams are also arranged behind the oscillating masses and extend perpendicular to the principal direction of oscillation so as to facilitate flexion in this direction. Coupling beams are formed by beams in the form of an arc of a circle which join the front faces of the masses and which are connected at their middles to other beams joined at their ends to the substrate and which extend in the direction of oscillation. Phase opposition of the movement of the masses produces simple bending of the beams in the shape of an arc and beams connected to the substrate, whereas a movement in phase of the masses produces traction and compression almost without any movement of the beams linked to the substrate and bends in complex modes. The system of coupling beams is therefore much more rigid for in-phase oscillations and does not allow these to be easily produced.

Some drawbacks of the existing systems are due to the fact that beams form a complex pattern which is sensitive to manufacturing uncertainties and to other deformations, and are despite efforts to the contrary, subject to a fairly significant degree of deformation associated with undesirable phase relationships. It may also be remarked that significant oscillation movements require long beams which therefore extend far from the masses, in particular in the principal direction of oscillation, and which increase the size of the oscillator.

SUMMARY OF THE INVENTION

The purpose of the invention is to provide a resonator with a beam structure which is simpler, of smaller dimensions and in which the coupling between oscillations of masses is properly achieved for a unique and determined phase relationship.

The suspension beams are all connected to the masses through coupling beams. This implies that there is a path leading from each anchorage point of the beams on the substrate to each of the masses, following the network of beams whereas in the earlier design, the suspension beams proper are always separated from the coupling beams and generally lead directly to a single mass. The network of beams obtained in this way generally exhibits two axes of symmetry, in the principal direction of the oscillations and along a direction which is perpendicular to the previous direction, but also parallel to the substrate.

This is described in document U.S. Pat. No. 5,349,855. In the invention, however, the network of suspension beams and coupling beams is unique and continuous and includes beams for attachment to the substrate, beams for attachment to the masses, and in a more noteworthy manner a junction beam which extends along a closed line to which all attachment beams are connected. The elastic deformations produced on oscillation are essentially concentrated on the junction beam; it is favourably curved so as not to produce concentrations of stresses. In advantageous manufacturing options it is arranged around the two masses; if these have a half-moon shape with facing rectilinear sides and curved sides facing the junction beam, a highly compact resonator is obtained. This continuous junction beam arrangement which extends along a closed line without passing through any masses or any other rigid part or fixed point of the structure ensures that there is not only good coupling of masses in the desired phase relationship but also that there is good flexibility of suspension which gives large displacements and measurement sensitivities.

The attachment beams to the substrate may include anchorage beams which extend overall in the direction of alignment of the masses between two regions of attachment to the substrate, and link beams which are perpendicular to the anchorage beams and which are joined to the anchorage beams at mid-distance from the regions of attachment. This arrangement tends to reduce the oscillations produced in the direction which is perpendicular to the principal direction.

The elements which produce oscillation may be placed between the junction beam surrounding the masses and the masses themselves, which contributes to the degree of compactness which is being sought.

The substrate may include a decoupling frame which surrounds the masses, the means for producing oscillation and the beams, and which is fixed to an underlying portion of the substrate by two frame anchorage regions aligned along a principal direction of oscillation of the masses. If the attachment beams to the masses are then in alignment with the frame anchorage regions, the frame and the junction beam may be designed to form end-stops in front of the frame anchorage regions; and if the oscillating masses have facing sides designed to form a mutual end-stop, the oscillation movements of the masses may be limited in this way.

According to other advantageous options for manufacture, the masses extend between the elements for producing oscillation and possess opposite facing sides between them equipped with interlocking electric combs. It will be seen that this arrangement reinforces the stability of the oscillating movement.

According to other factors the masses may each be made up of two sub-masses place symmetrically along a principle direction of oscillation of the masses, and the coupling beams include for each mass a sub-assembly of beams which extends between the sub-masses and which include two beams respectively linked to the sub-masses and to an interconnection beam, with the beams connected to the sub-masses extending along a principal direction of oscillation of the masses. The sub-masses may then mutually oscillate in one direction, move perpendicularly to the principle oscillation direction and provide an accelerometer with two measurement axes. The coupling beams may advantageously extend along the rigid beams (at least in the range of frequencies considered) which each extend around a mass and which bear elements which produce oscillation of the masses. The rigid beams may advantageously extend along closed lines and possess facing portions equipped with interlocking electrostatic combs common to the two masses instead of the latter being placed around the masses themselves as in other, less compact, arrangements.

Measurement of oscillations in the second direction may be achieved with the capacitance measurement electrodes with the masses, with the electrodes being fixed to the substrate and arranged in housings for the masses and having an asymmetric shape in the direction of oscillation of the masses. The asymmetric shape reinforces the capacitance variation resulting from the oscillations.

BRIEF DESCRIPTION OF THE DRAWINGS

The invention will now be described with reference to the following figures which illustrate certain specific preferred manufacturing options.

DETAILED DESCRIPTION OF THE PREFERRED EMBODIMENTS

Figure 1:
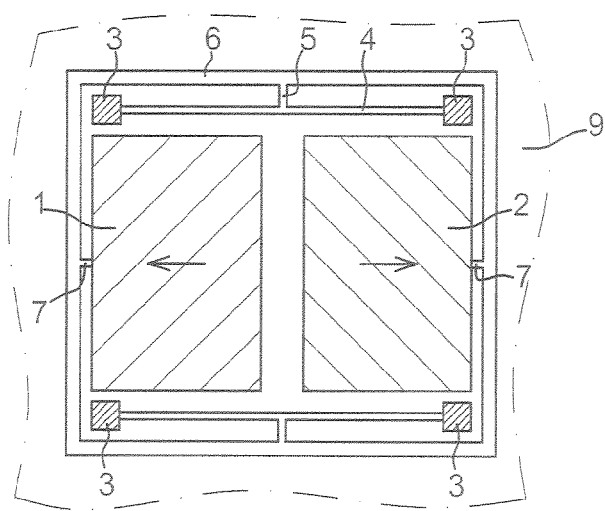
FIG. 1 is a view of one option for manufacture of the invention.
Figure 2:
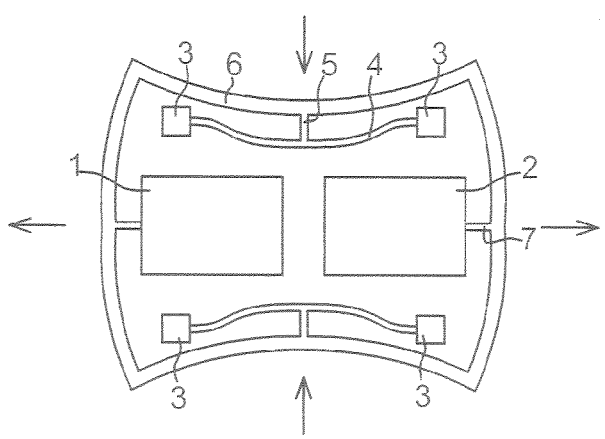
FIG. 2 illustrates the deformations for this manufacturing option when the masses oscillate.

FIG. 1 thus represents a particularly simple manufacturing mode where two masses 1 and 2 arranged next to each other are connected by anchorage points 3 to an underlying substrate 9, not shown in detail, which extends beneath the entire device. The anchorage points 3 are arranged as a quadrilateral at the exterior corners of the masses 1 and 2 through a single network of beams which include two anchorage beams 4, each of which is linked to two respective anchorage points 3 whilst extending parallel to the alignment of masses 1 and 2, two short attachment beams 5, perpendicular to the above and linked to their respective middles, a junction beam 6 in the form of a rectangle extending around masses 1 and 2 and anchorage points 3 and 4, and two short attachment beams 7 to the masses which extend between the junction beam 6 and the masses 1 and 2, whose direction is the same as that of the alignment of masses 1 and 2. This network of beams both ensures that masses 1 and 2 are suspended from the substrate by the anchorage points 3 and that those masses 1 and 2 are coupled to each other: when masses 1 and 2 oscillate in the principal direction of oscillation (which is the same as the direction of alignment of the masses) and in phase opposition, when approaching or moving away from each other, the network of beams deforms as shown in FIG. 2: the rectangle of the junction beam deforms, with the two sides becoming convex and the other two concave, and the anchorage beams 4 effectively deform like the sides of the junction beam 6 which is parallel and adjacent to them. Attachment beams 5 and 7 undergo practically no deformation. This system is flexible for the deformations shown in phase opposition, but is much more rigid for in-phase movements of the masses in the same direction, as the movements of the junction beam assembly 6 which would be proposed in the direction of oscillation and rendered almost impossible at the junctions to the attachment beams 5.

The beam network thus ensures coupling of masses 1 and 2 which encourages the desired oscillation phase relationship.

Figure 3:
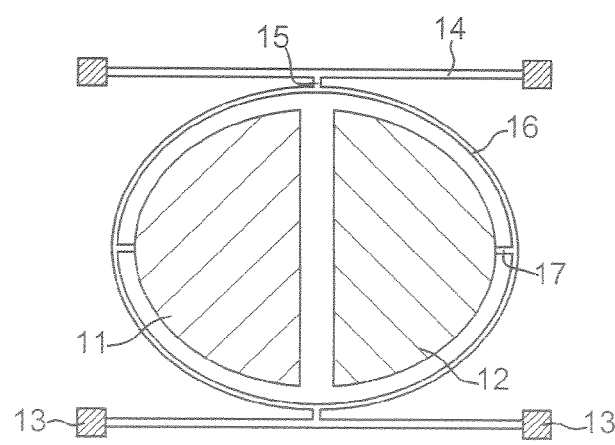
FIGS. 3, 4, 5, 6 and 7 illustrate other manufacturing options for the invention.

The rectangular shape of the junction beam 6 has angles in which concentrations of complex deformations or stresses may be produced. It is possible to prefer a curved junction beams for this, as shown in FIG. 3, which is arranged around the two masses 11 and 12 of a half-moon shape and which has a shape which is oval, or elliptical, or circular, as desired. The anchorage points 13, the anchorage breams 14, the attachment beams to the substrate 15, attachment beams to the masses 17 are not modified relative to preceding manufacturing option. The anchorage beams 14 however here extend outside the junction beam 16, which is therefore close to the masses 11 and 12 that are made in the form of half-moons to improve the compactness of the assembly. The anterior sides of the half-moon shapes, opposite one another, are flat and their rear sides, opposite the junction beam 16 and linked to the respective attachment beams 17, are curved, and follow the profile of the junction beam 16 at a small distance from it.

Figure 4:
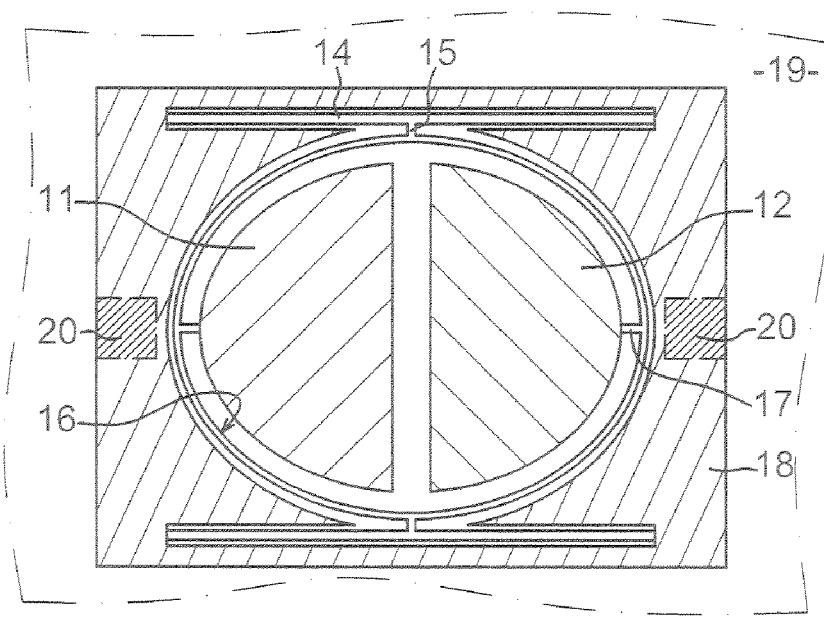

FIG. 4 shows a manufacturing option similar to FIG. 3, except that one cannot really talk about anchorage points 13, but rather a decoupling fame 18 which is connected to an underlying substrate 19 by opposite anchorage points 20 located in the alignment direction of the masses 11 and 12, a short distance from the junction beam 16 and the attachment beams to the masses 17. The masses 11 and 12 and the beams are housed in a hollow of the decoupling frame 18. This structure has the advantage of a greater degree of decoupling between the substrate 19 and the oscillating system.

Figure 5:
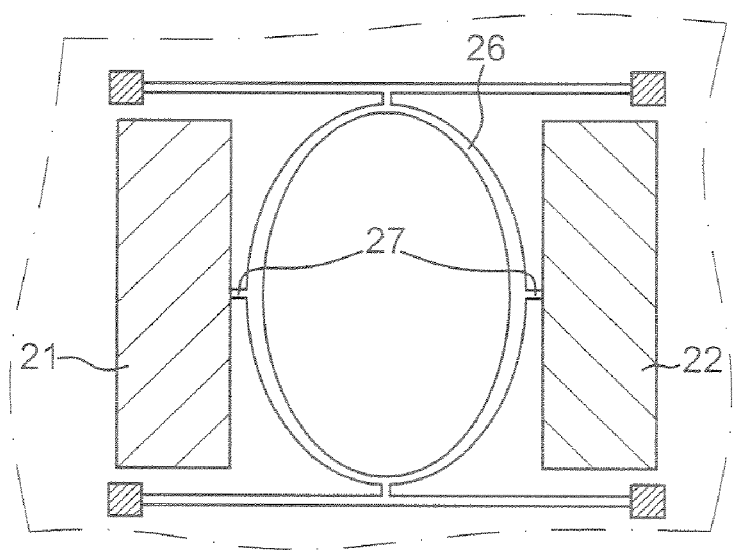

A different manufacturing variation is shown in FIG. 5. The junction beam 16 is replaced by a junction beam 26 arranged between the masses 21 and 22, which may without difficulties be of parallelepiped shapes like the masses 1 and 2 encountered at the beginning. The same network of anchorage beams and attachment beams is found as previously, although here only the attachment beams to the masses, here 27, are connected to the front side of the masses 21 and 22. This system works well for high frequencies and low movement amplitudes. The junction beam 26 is rounded, oval, circular, elliptical etc. like the junction beam 16.

Figure 6:
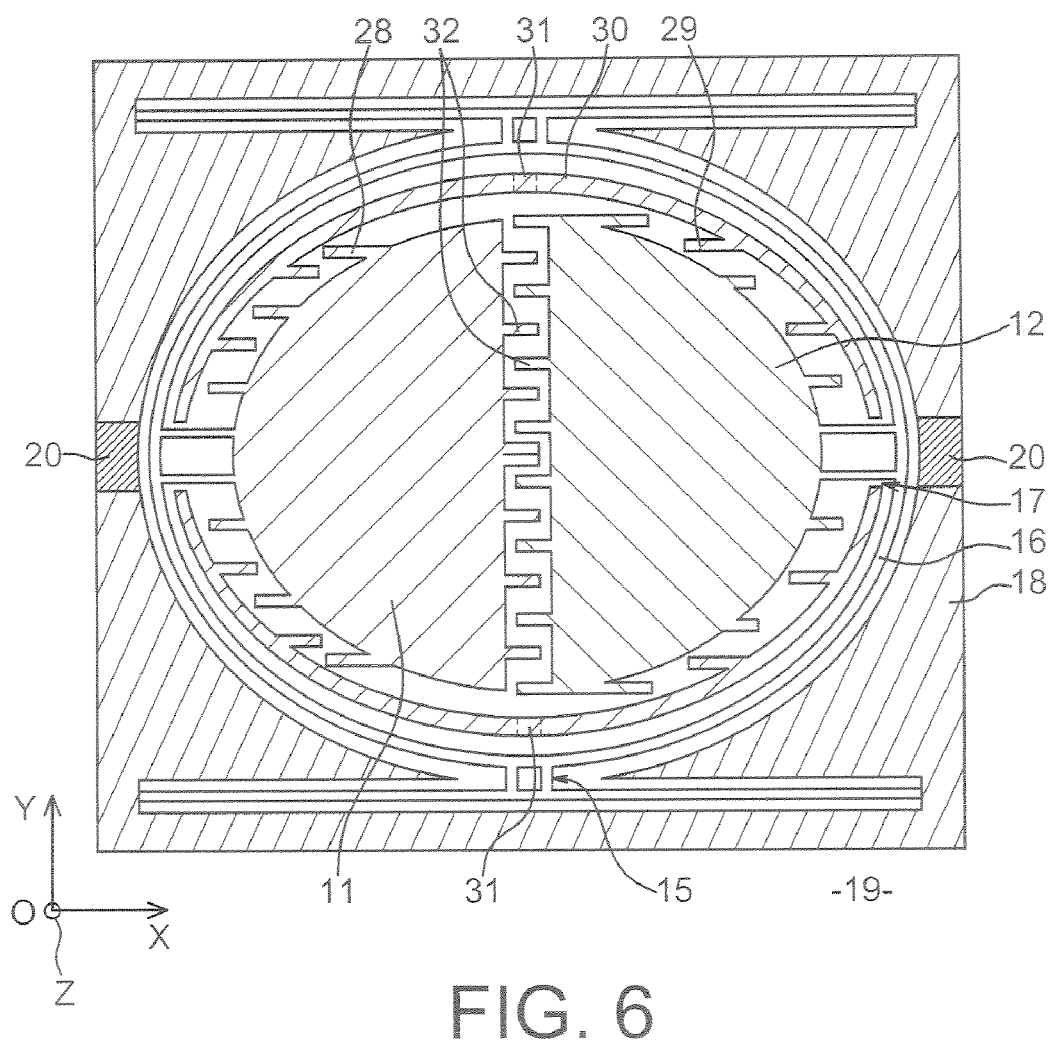

A more complete description of a simple realisation of the invention is shown in FIG. 6. The characteristics of the manufacturing option in FIG. 4 can be recognised, with, in particular, the decoupling frame 18, the curved junction beam 16 and the masses in the shape of half-moons 11 and 12. The means for producing oscillation are shown, which are formed in the conventional manner from combs with interlocking teeth or extensions 28 and 29, or "interdigitised", according to a term which is widely used in practice. These are the source of the electrical attraction forces. Certain of the teeth 28 are placed on the rear face of the masses with a half-moon shape 11 and 12, and the additional teeth 29 are placed on the fixed elements 30 in the from of an arc extending between the two masses 11 and 12 and the junction beam 16, up to the attachment beam to the masses 17 and which are retained on the substrate 19 by anchorage points 31. This particular arrangement means that only a small additional volume is used for the elements used to produce oscillation, and that the compactness of the device is therefore not adversely affected. The masses 11 and 12 are equipped with other extensions in the form of interlocking teeth of a comb which are interlinked one into the other at their front faces. They have the reference 32. The interlocking of these combs produces electrostatic stabilisation forces which oppose unwanted movements of the masses 11 and 12 perpendicular to the principal direction of oscillation x, in the vertical axis y of the figure. The masses 11 and 12 are precisely balanced so that their principal axis of inertia is along the central alignment line. Extensions 28 and 32 are in particular placed symmetrically on either side of this line. It is also recommended that for each mass 11 or 12, extensions 32 of the front faces be extended from the extensions 28 of the rear sides; the sum of the masses of elements 28 and 17 extending over the rear side of the oscillating masses 11 and 12 gives the same mass as the total for extensions 32 located on the front side.

If these conditions are applied, it can be seen that the oscillating masses are much less likely to move perpendicularly to the direction of oscillation as a result of imperfections in manufacture and external or internal constraints.

The attachment beams 15 and 17 are here split into two parallel beam elements in order to offer improved resistance to torsion. It has already bean remarked that the attachment beams cannot undergo much deformation because of their short length, and is in addition desirable to avoid deforming them, in particular those found outside the plane of the diagram, in the third direction Z which can only produce additional oscillatory motions which have a deleterious effect on measurements.

End stops for limiting the movement of the masses 11 and 12 are provided by contact of the teeth 32 with the opposite mass and in the other direction by contact of the junction beam 16 deforming against the uncoupling frame 18 at the anchorage points 20. The reaching of end-stops always involves components at the same electrical potential and therefore does not disturb the operation of the device.

Figure 7:
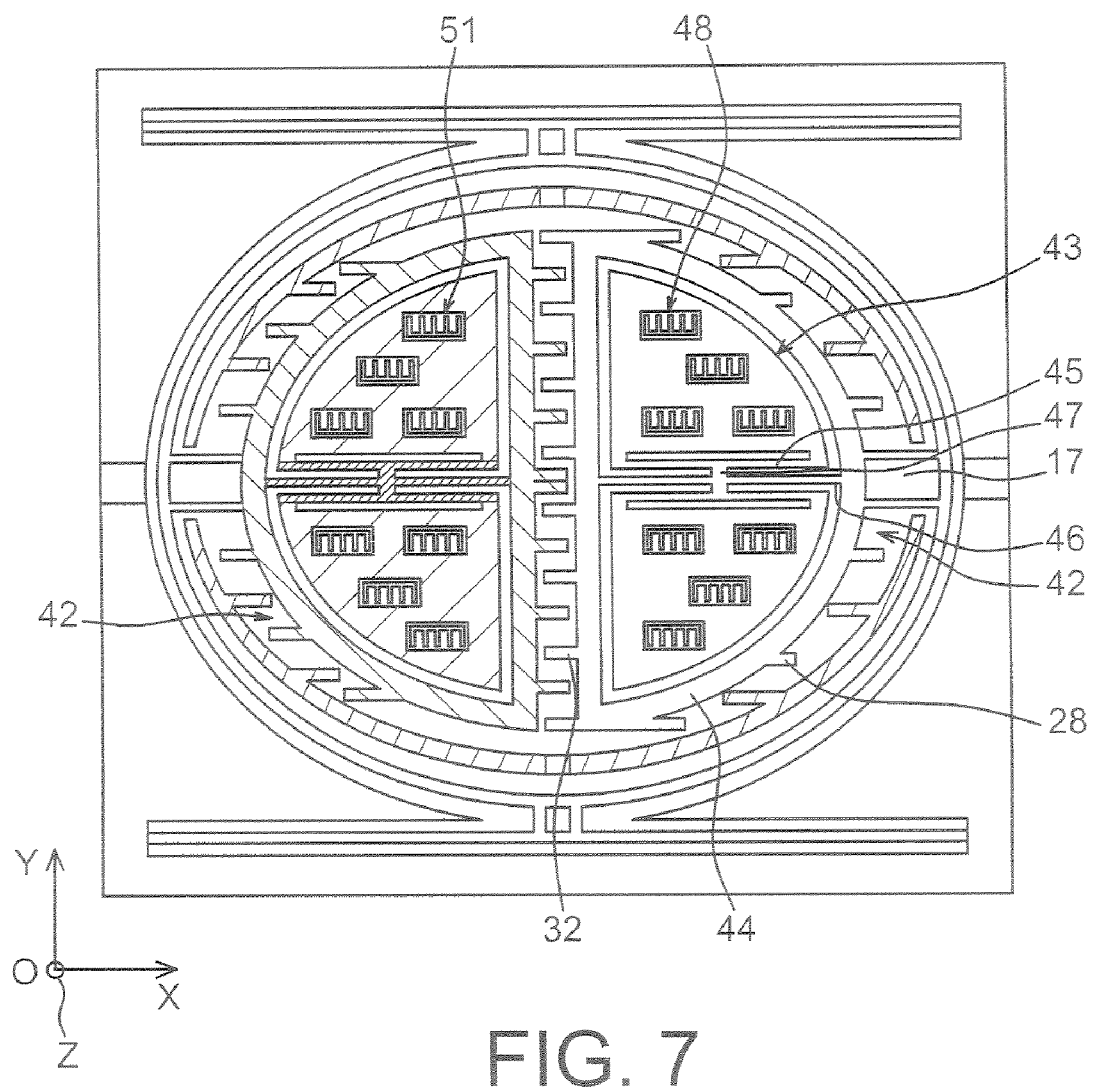

Moving on now to the more complex realisation in FIG. 7, the monolithic masses 11 and 12 are here replaced by complex masses 41 and 42 in the overall shape of a half-moon. These oscillating elements however are here made up of sub-masses 43 in the shape of quarter-moons, two of which form each of masses 41 and 42. Complex masses 41 and 42 are surrounded by support elements 44 which extend along a closed line made up of one diameter and one half-circumference of a circle. These beams include interlocking teeth 28 and 32 similar to those in the previous realisation. The attachment beams 17 extend and are connected to the support elements 44 and are now attached only indirectly to the masses 41 and 42. The support elements 44 resemble closed contour beams and may be regarded as coupling beams, but are significantly thicker than the other beams to the extent that they almost no longer deform.

The support beams 44 therefore belong to the network of beams which connect oscillating masses 41 and 42 to the substrate. The network also includes beams which extend between the sub-masses 43 in the form of quarter-moons, more specifically: two flexing beams 45 the ends of each of which are connected to a respective sub-mass 43 and which extend along the principal direction of oscillation of masses 41 and 42, a connecting beam 46 which joins two opposite points of the support element 44 and which is extends to prolong the attachment beams 17, in the principal direction of oscillation between a pair of flexing beams 45, and a short interconnection beam 47 which is aligned perpendicular to the principal direction of oscillation and which connects the pair of flexing beams 45 to the connecting beam 46.

Such a system can be used as dual axis gyro. It includes the option provided by earlier realisations and in addition allows Coriolis force accelerations to be measured which act in the Y direction of the device and which produce bending of the flexible beams 45.

The measurement device is made up of fixed electrodes 48 arranged in the housings of sub-masses 43. The fixed electrodes 48 are used to measure electrical capacitances between themselves and the sub-masses 43. When the sub-masses 43 move, the fixed electrodes 48 approach certain parts of their housing and move away from others; the total capacitance is modified depending on the movements of the sub-masses 43. Sensitive measurements can be obtained if the fixed electrodes 48 are asymmetric, for example crenellated on one side and smooth on the other. In the present case the crenellated side is aligned in the direction perpendicular to the principal direction of oscillation in order to measure movements of the quarter-moons in this perpendicular direction.

The fixed electrodes 48 are arranged symmetrically at the centre of inertia of the quarter-moons relative to the two directions of oscillation.

Figure 9:
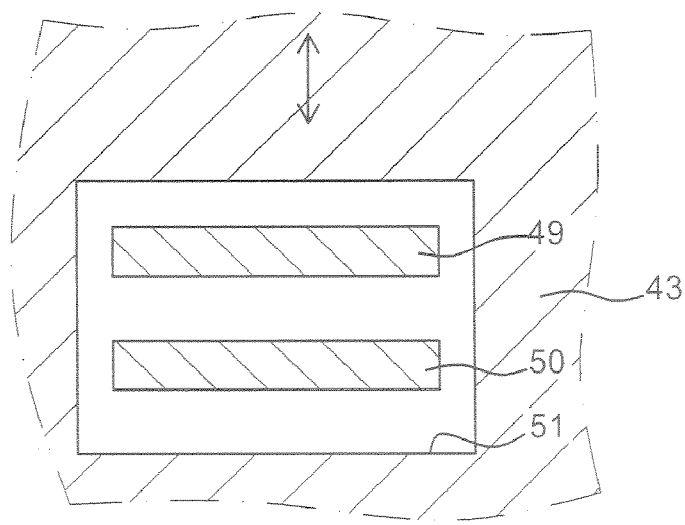
FIG. 9 illustrates another type of measurement electrode design.

The crenellations can be of various shapes and openings. Another mode of manufacture of the fixed electrodes would involve arranging two twinned flat electrodes 49 and 50 as shown in FIG. 9, whose capacitance relative to the housing 51 would be measured independently. The movement of the sub-mass 43 would cause a reduction in one of the capacitances and a correlative increase in the other. Measurement by subtraction of capacitances would provide a sensitive evaluation of the movement.

Figure 8:
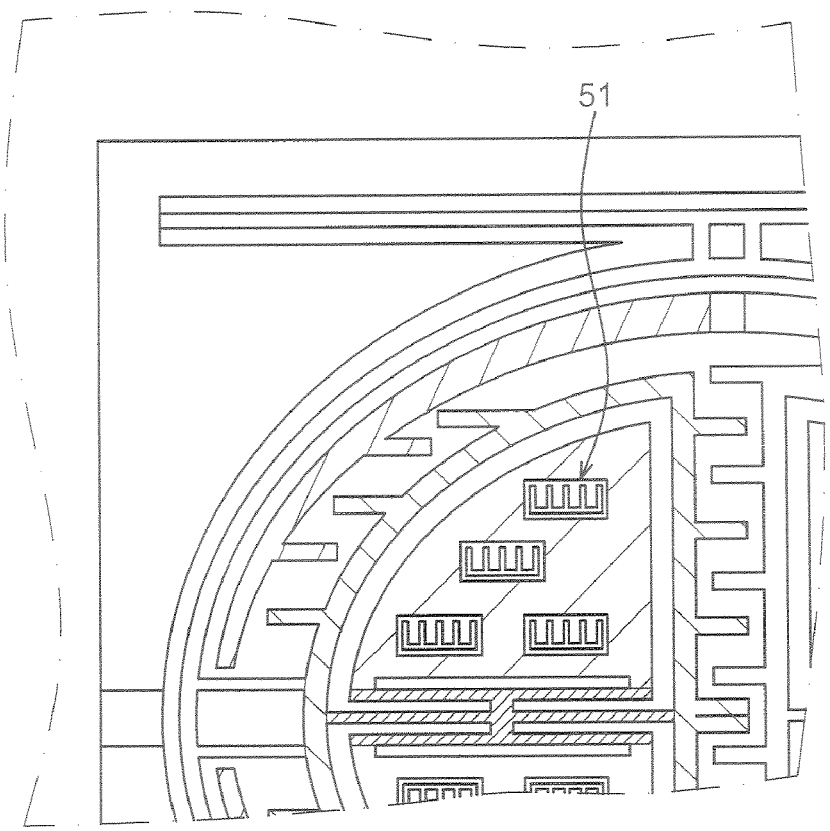
FIG. 8 is an enlargement of a part of FIG. 7.

Here in more detail is the manner in which the complex realisation in FIGS. 7 and 8 would be used. Apart from the usual detection of angular acceleration in direction Y, it lends itself well to the angular acceleration direction in the third direction Z, through oscillation of masses in direction X. It is therefore the movement of masses 41 and 42 in direction Y which is measured, in response to the Coriolis forces produced in this direction. For each of the masses 41 and 42, the total variation in capacitances recorded at the fixed electrodes 48 of each of the total sub-masses 43 are measured and subtracted from each other to obtain a larger result and more precise measurement, because of the essentially equal movements (antisymmetric) of the sub-masses 43 combined with the symmetrical arrangement of the fixed electrodes 49 between the sub-masses 43 of each mass 41 or 42. The measurement by subtraction also eliminates the effects of unwanted oscillation of the sub-masses 43 in the Y direction relative to each other. The measurements of each of the masses 41 and 42 must also give opposite results. It is possible to correlate them by another subtractive measurement to eliminate the effect of unwanted oscillations in the Y direction.

The combs encountered in this invention have tooth overlap lengths which are significantly larger than those which are normally used. The extra electrostatic forces between the combs maintain them in a centring position, against disturbances which the oscillating system may be subjected to. For oscillation amplitudes of 5 µm for example, teeth of 7 µm in length are normal.

Total lengths of about 97 µm, that is 90 µm more, and therefore an overlap length (92 µm) greater than the oscillation amplitude are proposed in this example which is in accordance with the invention. The larger volume of the combs is compensated for by a much greater freedom in the design of the beams, which no longer have to provide guidance in the oscillation direction through an assembly stiffness which is greater in the perpendicular direction. The network for these may therefore be much simplified.

These resonators may be manufactured using conventional techniques for deposition and engraving etc. normally used in micromechanical engineering, so that no description of this will be given here.

The invention claimed is:

1. A resonator comprising:
   a substrate;
   at least two oscillating masses;
   means for making the masses oscillate using electrical forces, suspension beams for suspending the masses from the substrate, and coupling beams that link the masses together, wherein the suspension beams are all connected to the masses through the coupling beams, with the suspension beams and the coupling beams forming a continuous single assembly of beams that includes attachment beams to the substrate and attachment beams to the masses,
   wherein the continuous single assembly of beams also includes a junction beam that undergoes deformation according to oscillation of the masses, extending along a closed line to which the attachment beams to the substrate and the attachment beams to the masses are connected.

2. A resonator according to claim 1, wherein the junction beam extends over a curved line.

3. A resonator according to claim 1, wherein the junction beam surrounds the masses, which are in a form of half-moons that have rectilinear sides opposite each other and curved sides opposite the junction beam.

4. A resonator according to claim 1, wherein the attachment beams to the substrate include anchorage beams that extend overall in a direction of alignment of the masses between two regions of attachment to the substrate, which are perpendicular to the anchorage beams and joined to the anchorage beams at mid-distance from the regions of attachment.

5. A resonator according to claim 3, wherein the junction beam surrounds the masses, and the means for making the masses oscillate includes elements for producing oscillation located between the junction beam and the masses.

6. A resonator according to claim 1, wherein the substrate includes a decoupling frame that surrounds the masses, the means for making the masses oscillate, and the suspension beams and the coupling beams, and said decoupling frame being fixed to an underlying portion of the substrate by two frame anchorage regions aligned in a principal direction of oscillation of the masses.

7. A resonator according to claim 6, wherein the attachment beams to the masses are aligned with the frame anchorage regions.

8. A resonator according to claim 7, wherein the frame and the junction beam are configured to form end-stops in front of the frame anchorage regions and the oscillating masses possess opposite sides configured to form a mutual end stop.

9. A resonator according to claim 5, wherein the masses extend between the means for making the masses oscillate and possess opposite sides between said masses equipped with interlocking electric combs.

10. A resonator according to claim 1, wherein the masses each include two-sub-masses placed symmetrically along a principle direction of oscillation of the masses, and the coupling beams include, for each mass, a sub-assembly of beams that extends between the sub-masses and that include two beams respectively linked to the sub-masses and to an interconnecting beam with the two beams connected to the sub-masses extending along a principal direction of oscillation of the masses.

11. A resonator according to claim 1, further comprising electrodes for measuring capacitance with the masses, the electrodes being fixed to the substrate and arranged in mass housings and being asymmetric along a direction of oscillation of the masses.

12. A resonator according to claim 1, wherein the means for making the masses oscillate includes interlocking toothed combs that exhibit an overlap length that is greater than an oscillation amplitude of the oscillating masses.

13. A resonator according to claim 9, wherein the interlocking electrical combs have teeth with a total mass equal to a total mass of extensions present on a face opposite the teeth of each oscillating mass.

* * * * *